United States Patent
Woo et al.

(10) Patent No.: US 11,645,212 B2
(45) Date of Patent: May 9, 2023

(54) DYNAMIC PROCESSING SPEED

(71) Applicant: Rambus Inc., San Jose, CA (US)

(72) Inventors: Steven C. Woo, Saratoga, CA (US); Thomas Vogelsang, Mountain View, CA (US); Joseph James Tringali, Los Altos, CA (US); Pooneh Safayenikoo, Columbia, MO (US)

(73) Assignee: Rambus Inc., San Jose, CA (US)

( * ) Notice: Subject to any disclaimer, the term of this patent is extended or adjusted under 35 U.S.C. 154(b) by 25 days.

(21) Appl. No.: 17/504,739

(22) Filed: Oct. 19, 2021

(65) Prior Publication Data
US 2022/0138125 A1 May 5, 2022

Related U.S. Application Data

(60) Provisional application No. 63/108,781, filed on Nov. 2, 2020.

(51) Int. Cl.
*G06F 9/30* (2018.01)
*G06F 13/16* (2006.01)
*H01L 25/18* (2023.01)
*H01L 25/065* (2023.01)

(52) U.S. Cl.
CPC ...... *G06F 13/1668* (2013.01); *H01L 25/0657* (2013.01); *H01L 25/18* (2013.01); *H01L 2225/06541* (2013.01)

(58) Field of Classification Search
CPC . G06F 13/1668; H01L 25/0657; H01L 25/18; H01L 2225/06541
See application file for complete search history.

(56) References Cited

U.S. PATENT DOCUMENTS

| | | | | |
|---|---|---|---|---|
| 7,533,382 B2* | 5/2009 | Karim | ................ | G06F 9/4843 712/32 |
| 9,484,326 B2* | 11/2016 | Keeth | ................ | H01L 25/18 |
| 10,083,722 B2* | 9/2018 | Oh | ................ | G11C 5/02 |
| 11,043,472 B1* | 6/2021 | Dokania | ................ | H01L 23/49894 |
| 2010/0078635 A1* | 4/2010 | Kuroda | ................ | G11C 29/02 438/107 |
| 2010/0078829 A1* | 4/2010 | Hargan | ................ | H01L 25/0657 438/109 |

(Continued)

OTHER PUBLICATIONS

Chen, Yen-Lin et al., "Learning-Directed Dynamic Voltage and Frequency Scaling Scheme With Adjustable Performance for Single-Core and Multi-Core Embedded and Mobile Systems", Sensors 2018, 18, 3068, www.mdpi.com/journal/sensors, 2018, 25 pages.

(Continued)

*Primary Examiner* — Cheng Yuan Tseng
(74) *Attorney, Agent, or Firm* — The Neudeck Law Firm, LLC

(57) ABSTRACT

Processing elements include interfaces that allow direct access to memory banks on one or more DRAMs in an integrated circuit stack. These additional (e.g., per processing element) direct interfaces may allow the processing elements to have direct access to the data in the DRAM stack. Based on the size/type of operands being processed, and the memory bandwidth of the direct interfaces, rate calculation circuitry on the processor die determines the speed each processing element and/or processing nodes within each processing element are operated.

20 Claims, 8 Drawing Sheets

(56) References Cited

U.S. PATENT DOCUMENTS

| | | | | |
|---|---|---|---|---|
| 2014/0331025 | A1* | 11/2014 | Kwon | G06F 9/3889 |
| | | | | 712/20 |
| 2015/0177821 | A1* | 6/2015 | Senthinathan | G06F 9/3887 |
| | | | | 713/324 |
| 2021/0050338 | A1* | 2/2021 | Juengling | G11C 11/4085 |
| 2021/0398339 | A1* | 12/2021 | Hong | G06F 9/3851 |
| 2022/0138125 | A1* | 5/2022 | Woo | H01L 25/18 |
| | | | | 710/107 |

OTHER PUBLICATIONS

Kang, Kyungsu et al., "Performance Maximization of 3D-Stacked Cache Memory on DVFS-enabled Processor", 2010 International SoC Design Conference, Seoul, IEEE ISOCC 2010, 2010, pp. 47-50. 4 Pages.

Scrbak, Marko et al., "DVFS Space Exploration in Power Constrained Processing-in-Memory Systems", 10.1007/978-3-319-54999-6_17, 2017, 12 pages.

Yun, Woojin et al., "Temperature-Aware Energy Minimization of 3D-Stacked L2 DRAM Cache Through DVFS", 2012 International SoC Design Conference, Jeju Island, IEEE ISOCC 2012, 2012, pp. 475-478. 4 Pages.

Zhang, Dong Ping et al., "TOP-PIM: Throughput-Oriented Programmable Processing in Memory", HPDC '14, 2014, 13 Pages.

* cited by examiner

ACCESS, BY A PLURALITY OF PROCESSING ELEMENTS ON A PROCESSOR DIE, RESPECTIVE ONES OF A PLURALITY OF MEMORY ARRAYS ON A MEMORY DEVICE DIE ELECTRICALLY COUPLED TO, AND STACKED WITH, THE PROCESSOR DIE, INDEPENDENTLY OF THE OTHER OF THE PROCESSING ELEMENTS VIA RESPECTIVE ARRAY ACCESS INTERFACES
702

DETERMINE A FIRST OPERAND SIZE INDICATOR ASSOCIATED WITH A FIRST OPERAND SIZE CORRESPONDING TO DATA BEING COMMUNICATED BETWEEN THE RESPECTIVE ONES OF THE PLURALITY OF MEMORY ARRAYS AND THE PLURALITY OF PROCESSING ELEMENTS
704

OPERATE THE PROCESSING ELEMENTS AT A FIRST OPERATING FREQUENCY THAT IS SELECTED BASED ON THE FIRST OPERAND SIZE INDICATOR.
706

*FIG. 7*

DYNAMIC PROCESSING SPEED

BRIEF DESCRIPTION OF THE DRAWINGS

FIG. 7 is a flowchart illustrating a method of operating a processing array.

DETAILED DESCRIPTION OF THE EMBODIMENTS

In an embodiment, an interconnected stack of one or more Dynamic Random Access Memory (DRAM) die has one or more processor die(s). The processor die may be attached and interconnected vertically with the DRAM die(s) by shared through-silicon via (TSV) connections that carry data and control signals throughout the stack. The processor die may include one or more arrays of processing elements. These processing elements may be designed and/or architected for the fast execution of, for example, general purpose computing, graphics rendering, signal processing, artificial intelligence, neural network, and/or machine learning tasks.

In an embodiment, the processing elements may include interfaces that allow direct access to memory banks on one or more DRAMs in the stack. These additional (e.g., per processing element) direct interfaces may allow the processing elements to have direct access to the data in the DRAM stack. This more direct access allows more rapid access to the data in the DRAM stack for tasks such as (but not limited to): rapidly loading weights to switch between neural network models, overflow for large neural network models, and rapidly storing and/or retrieving activations.

In an embodiment, based on the size/type of operands being processed, and the memory bandwidth of the direct interfaces, rate calculation circuitry on the processor die determines the speed each processing element and/or processing nodes within each processing element are operated. This helps prevent the processing nodes from spending time waiting for data to arrive via the direct interface thereby improving power efficiency.

Figure 1:
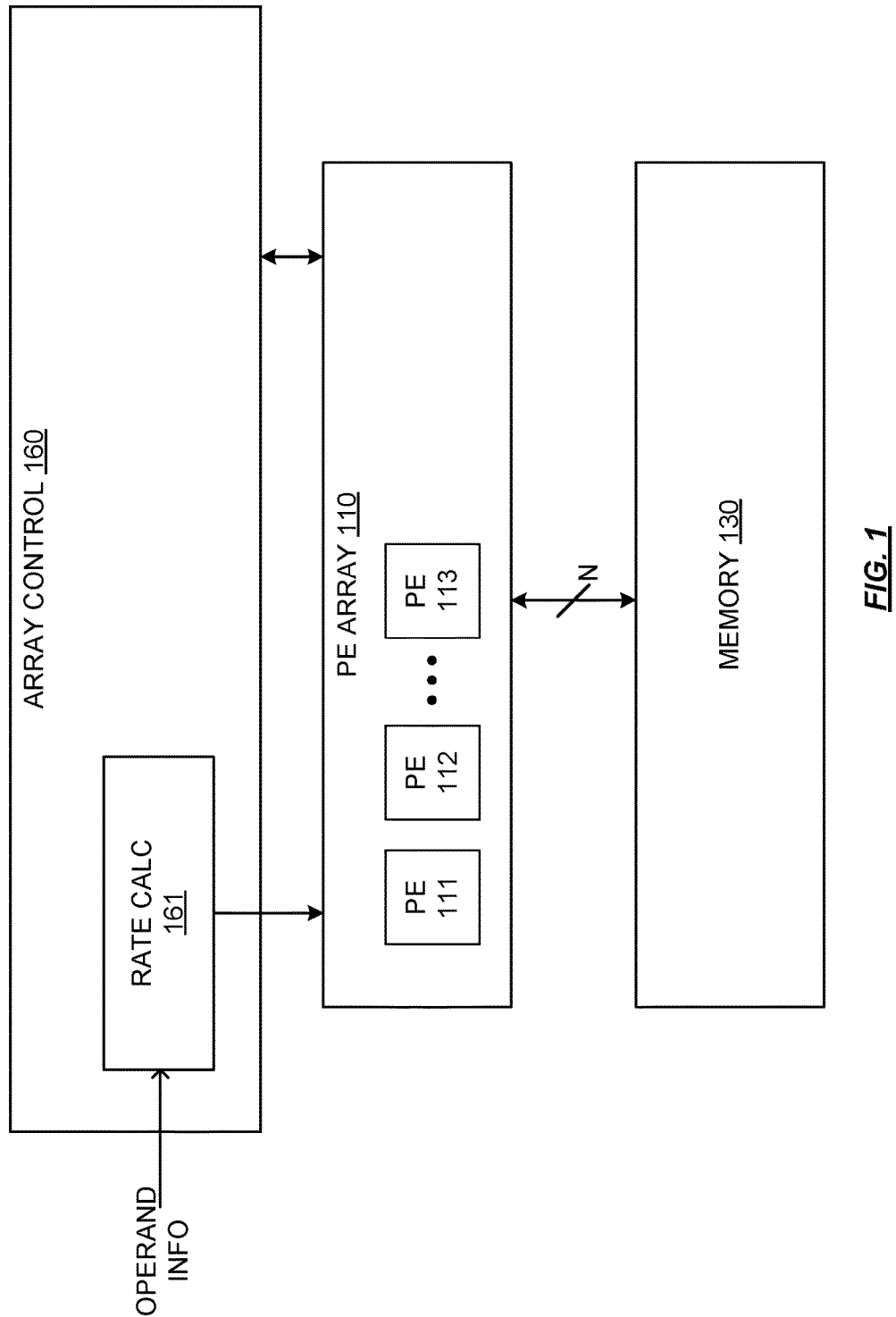
FIG. 1 is a block diagram illustrating a system having a dynamic processing speed.

FIG. 1 is a block diagram illustrating a system having a dynamic processing speed. In FIG. 1, processing system 100 includes processing element array 110, memory 130, and array control 160. Array control 160 includes rate calculator 161. Processing element array 110 includes processing elements 111-113. Processing element array 110 is operatively coupled to memory 130 and array control 160. Array control 160 is operatively coupled to processing element array 110 to, among other functions, control operations, data flows, processing speeds, and/or configurations of processing element array 110.

In an embodiment, processing element array 110 may be arranged in a two-dimensional array. Each of the processing elements 111-113 of processing element array 110 includes or is coupled to memory 130. The processing elements 111-113 of processing element array 110 may be intercoupled to the nearest neighbor processing elements 111-113. Thus, a processing element 111-113 may be intercoupled to four adjacent processing elements 111-113. This nearest neighbor intercoupling allows data to flow from processing element 111-113 to processing element 111-113 in the two directions (e.g., left or right, and toward the front or toward the back.) These dataflows are reconfigurable by array control 160 so that they may be optimized for the task (e.g., matrix multiplication) and/or workload (e.g., size of matrices.) Thus, for example, the data flows of the array may be configured into one or more loops or fabrics that flow data in order to accomplish different parts of a calculation.

In an embodiment, the processing elements 111-113 of processing element array 110 may be arranged are arranged in a three-dimensional array. Each of the processing elements 111-113 includes or is coupled to memory 130. The processing elements 111-113 of processing element array 110 may be intercoupled to the nearest neighbor processing elements 111-113 in three dimensions. Thus, a processing element 111-113 on a first die may be intercoupled to a first processing element 111-113 on a second die that is located directly above the processing element 111-113, a second processing element 111-113 on a third die that is located directly below the processing element 111-113, and the four adjacent processing elements 111-113 on the first die.

This three-dimensional nearest neighbor intercoupling allows data to flow from processing element 111-113 to processing element 111-113 in the three directions (e.g., up or down, left or right, and toward the front or toward the back.) These dataflows are reconfigurable by array control 160 so that they may be optimized for the task (e.g., matrix multiplication) and/or workload (e.g., size of matrices.) Thus, for example, the data flows of the array may be configured into one or more loops that periodically recycle data in order to accomplish different parts of a calculation.

In an embodiment, based on information about the operands needed and results produced by processing elements 111-113 of processing element array 110, array control 160 sets the operating rate of processing elements 111-113. For example, processing elements 111-113 may have a maximum operating rate of 1 billion instructions per second (GIPS). Each instruction being executed may, for example, require one 32-bit operand be received from memory 130. Thus, each of processing elements 111-113 would, if operated at 1 GIPS, require 4 GB/s of data be received from memory 130. If, however, memory 130 can only supply 2 GB/s of data to each processing element 111-113, the rate that processing elements 111-113 complete instructions will be limited to 0.5 GIPS by the supply of data from memory 130. Thus, for this example, based on the information that each instruction being executed by processing elements 111-113 requires one 32-bit operand be received from memory 130, and the information that memory 130 can supply a maximum of 2 GB/s of data to each processing element 111-113, array control 160 would configure one or more clock signals to processing elements 111-113 of processing element array 110 such that processing elements 111-113 are operated at 0.5 GIPS. In this manner, the rate that processing elements 111-113 are operating (0.5 GIPS) more efficiently matches the maximum rate that memory 130 is supplying operands to processing elements 111-113.

In an embodiment, the rate that operands, results, and/or instructions are communicated between (i.e., read or written) processing elements 111-113 of processing element array 110 and memory 130 may be limited by the bandwidth of memory 130. For example, processing elements 111-113 may have a maximum operating rate of 1 billion instructions per second (GIPS). Each instruction being executed may, for example, require one 32-bit operand be received from memory 130. Thus, each of processing elements 111-113 would, if operated at 1 GIPS, require 4 GB/s of data be received from memory 130. If, however, memory 130 can only supply 2 GB/s of data to each processing element 111-113, the rate that processing elements 111-113 complete instructions will be limited to 0.5 GIPS by the supply of data from memory 130.

In an embodiment, array control 160 receives operand information via one or more indicators embedded in instructions to be processed by processing elements 111-113. In another embodiment, a register or other indicator in array control 160 is set to provide operand information. In an embodiment, array control 160 includes a look-up table that relates operand information and memory 130 bandwidth to operating rates for processing elements 111-113. In an embodiment, operand information comprises the data types to be (or are being) communicated with memory 130. An example of this type of table is illustrated in Table 1. Additional tables may relate operand information from other sources (e.g., registers, SRAM, DRAM, flash, etc.) to operating rates for processing elements 111-113.

TABLE 1

| Input operand data size for one operand | Memory 130 channel bandwidth option 1: 25.6 GB/s | Memory 130 channel bandwidth option 2: 32 GB/s |
|---|---|---|
| 8-bit | 1.6 GIPS | 2 GIPS |
| 16-bit | 0.8 GIPS | 1 GIPS |
| 32-bit | 0.4 GIPS | 0.5 GIPS |

Figure 2:
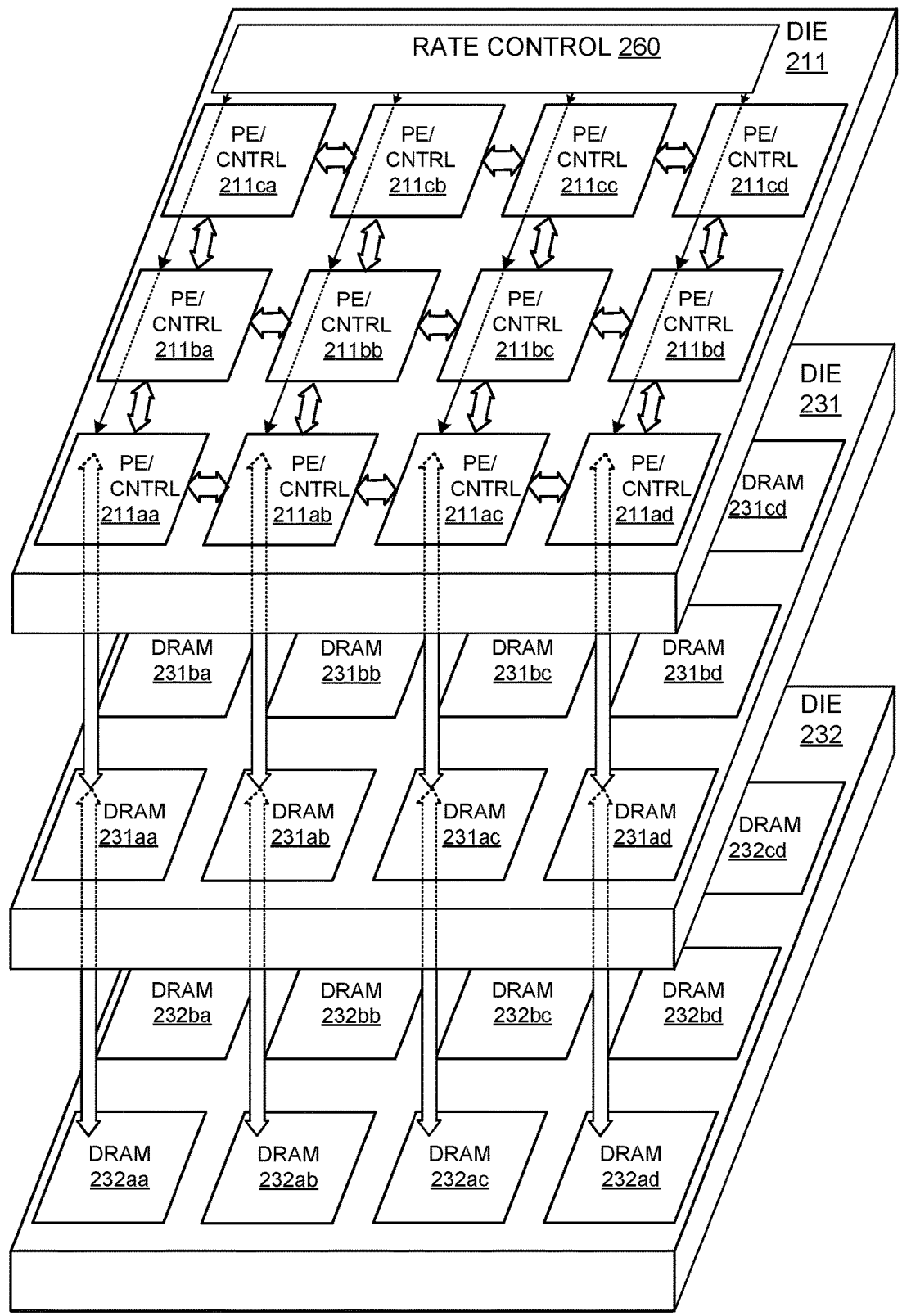
FIG. 2 is an isometric illustration of rate controlled integrated circuit device stack.

FIG. 2 is an isometric illustration of rate controlled integrated circuit device stack. In FIG. 2, processing system 200 comprises integrated circuit die 211, memory device die 231, and memory device die 232. Integrated circuit die 211, memory device die 231, and memory device die 232 are stacked with each other. Integrated circuit die 211 includes a two-dimensional array with 3 rows and 4 columns of processing elements (PEs) with controllers 211aa-211cd. In other words, die 211, and processing elements 211aa-211cd in particular include memory controller circuitry and other processing circuitry (e.g., an array of processing nodes, an ALU, a CPU, a GPU, DSP, etc.). Integrated circuit die 211 also include rate control 260.

Memory device die 231 is illustrated with two-dimensional array with 3 rows and 4 columns of memory regions 231aa-231cd. Likewise, memory device die 232 is illustrated with two-dimensional array with 3 rows and 4 columns of memory regions 232aa-232cd. It should be understood that the selection of 3 rows and 4 columns is merely for the purposes of illustration. Any number of rows and/or columns are contemplated. Note that in FIG. 2, some DRAM regions (e.g., DRAM regions 231ca-231cc 232ca-232cc) are obscured by die 211 or memory device die 231 and are therefore not visible in FIG. 2.

In an embodiment of processing system 200, each PE/controller 211aa-211cd of integrated circuit die 211 is intercoupled to its nearest neighbors in the left and right directions and the front and back directions. In another embodiment of processing system 200, one or more of PE/controllers 211aa-211cd (including all) of integrated circuit die 211 may not be intercoupled to another of PE/controllers 211aa-211cd or intercoupled to more than one of the other PE/controllers 211aa-211cd. In these embodiments, a two-dimensional array is illustrated in FIG. 2 as being on integrated circuit die 211. The intercoupling may comprise intercoupling circuitry that includes, but is not limited to, input and/or output (I/O) circuitry, buffer circuitry, parallel buses, serial busses, through-silicon via (TSV) connections, and the like. Thus, for example, PE/controller 211bb lies between PE/controller 211ba and PE/controller 211bc in the left and right directions. PE/controller 211bb therefore may be intercoupled with both PE/controller 211ba and PE/controller 211bc. Also, as an example, PE/controller 211bb lies between PE/controller 211cb and PE/controller 211ab in the front and back directions. PE/controller 211bb may therefore also be intercoupled with PE/controller 211cb and PE/controller 211ab. This pattern of being intercoupled with zero, one, or more, of the respective adjacent left-to-right (if present) and front-to-back (if present) PE/controller 211aa-211cd may be repeated for any number of and combinations of PE/controllers 211aa-211cd.

In an embodiment, PE/controllers 211aa-211cd and DRAM regions 231aa-231cd 232aa-232cd have the same size such that each PE/controllers 211aa-211cd on integrated circuit die 211 lies above respective DRAM regions 231aa-231cd 232aa-232cd on memory device die 231 and memory device die 232. Each PE/controller 211aa-211cd is also intercoupled with the corresponding DRAM regions 231aa-231cd 232aa-232cd that are above (or in another embodiment, below) that respective PE/controller 211aa-211cd. In other words, DRAM region 231aa lies directly below PE/controller 211aa and is intercoupled with PE/controller 211aa; DRAM region 232aa also lies directly below PE/controller 211aa and is intercoupled with PE/controller 211aa; DRAM region 231ab lies directly below PE/controller 211ab and is intercoupled with PE/controller 211ab; DRAM region 232ab also lies directly below PE/controller 211ab and is intercoupled with PE/controller 211ab, and so on. This vertical intercoupling is illustrated in FIG. 2 by the bidirectional arrows running from PE/controllers 211aa-211ad on integrated circuit die 211 to corresponding DRAM regions 231aa-231cd 232aa-232cd on memory device die 231 and memory device die 232. It should be understood that PE/controllers 211ba-211cd on integrated circuit die 211 are intercoupled to corresponding DRAM regions 231ba-231cd 232ba-232cd on memory device die 231 and memory device die 232. However, these arrows have been omitted from FIG. 2 because integrated circuit die 211 or memory device die 231 is at least partially obscuring them in the isometric view of FIG. 2.

It should be understood that, for the sake of brevity and clarity, only three dies 211, 231, and 232 are illustrated in FIG. 2. One or more additional dies, with additional two-dimensional arrays of PE/controllers, and/or DRAMs may be stacked with dies 211, 231, and 232 and intercoupled with PE/controllers 211aa-211cd in a like manner. These additional dies may form additional layers of two-dimensional PE/controller arrays so that the resulting three-dimensional PE/controller array has more than one layer in the vertical direction. Similarly, additional dies may form additional layers of memory devices so that the resulting three-dimensional memory device array has more than two layers in the vertical direction.

Each PE/controller 211aa-211cd may have associated memory which may be DRAM or SRAM (not shown in FIG. 2.) PE/controllers 211aa-211cd may include both processing logic, controller logic, and the associated memory on the same die. Rate control 260 is operatively coupled to each of PE/controllers 211aa-211cd. Rate control 260 is operatively coupled to each of PE/controllers 211aa-211cd to, based on the operands and/or results being communicated with DRAM regions 231aa-231cd 232aa-232cd and/or internal memory/registers, control the rate that PE/controllers 211aa-211cd are operated. In particular, rate control 260 may change the frequency of one or more clocks being supplied to the processing element circuitry of PE/controllers 211aa-211cd.

In an embodiment, the rate that operands, results, and/or instructions are communicated between (i.e., read or written) each PE/controller 211aa-211cd and DRAM regions 231aa-231cd 232aa-232cd on memory device die 231 may be limited by the bandwidth of DRAM regions 231aa-231cd 232aa-232cd. For example, each PE/controller 211aa-211cd may have a maximum operating rate of 1 billion instructions per second (GIPS). Each instruction being executed may, for example, require one 32-bit operand be received from an associated DRAM region 231aa-231cd 232aa-232cd. Thus, each of PE/controller 211aa-211cd would, if operated at 1 GIPS, require 4 GB/s of data be received from an associated DRAM region 231aa-231cd 232aa-232cd. If, however, DRAM regions 231aa-231cd 232aa-232cd can only supply 2 GB/s of data to its associated PE/controller 211aa-211cd, the rate that PE/controller 211aa-211cd complete instructions will be limited to 0.5 GIPS by the supply of data from its associated DRAM regions 231aa-231cd 232aa-232cd.

In an embodiment, based on information about the operands needed by PE/controller 211aa-211cd, rate control 260 sets the operating rate of PE/controllers 211aa-211cd. Thus, for the previous example, rate control 260, based on the information that each instruction being executed by PE/controllers 211aa-211cd requires one 32-bit operand be received from DRAM regions 231aa-231cd 232aa-232cd, and the information that DRAM regions 231aa-231cd 232aa-232cd can supply a maximum of 2 GB/s of data to each PE/controller 211aa-211cd, rate control 260 would configure one or more clock signals to PE/controller 211aa-211cd such that PE/controllers 211aa-211cd are operated at 0.5 GIPS. In this manner, the rate that PE/controllers 211aa-211cd are operating (0.5 GIPS) more efficiently matches the maximum rate that DRAM regions 231aa-231cd 232aa-232cd are supplying operands to PE/controllers 211aa-211cd.

In an embodiment, rate control 260 receives operand information via one or more indicators embedded in instructions to be processed by PE/controllers 211aa-211cd. In another embodiment, a register or other indicator in rate control 260 is set to provide operand information. In an embodiment, rate control 260 includes a look-up table that relates operand information and DRAM region 231aa-231cd 232aa-232cd bandwidth to operating rates for PE/controllers 211aa-211cd. In an embodiment, operand information comprises the data types to be (or are being) communicated with associated DRAM regions 231aa-231cd 232aa-232cd. An example of this type of table was illustrated in Table 1. Additional tables may relate operand information from other sources (e.g., registers, SRAM, DRAM, flash, etc.) to operating rates for DRAM regions 231aa-231cd 232aa-232cd.

In FIG. 2, die 211 is illustrated as having a single rate control block 260 that controls all of PE/controllers 211aa-211cd. It should be understood, however, that each PE/controllers 211aa-211cd may have its own rate control inside it (not shown in FIG. 2). Similarly, subsets of PE/controllers 211aa-211cd (e.g., a row of PE/controllers 211aa-211ad) may be controlled by a single rate control such that there are multiple rate controls 260 (not shown in FIG. 2).

Figure 3:
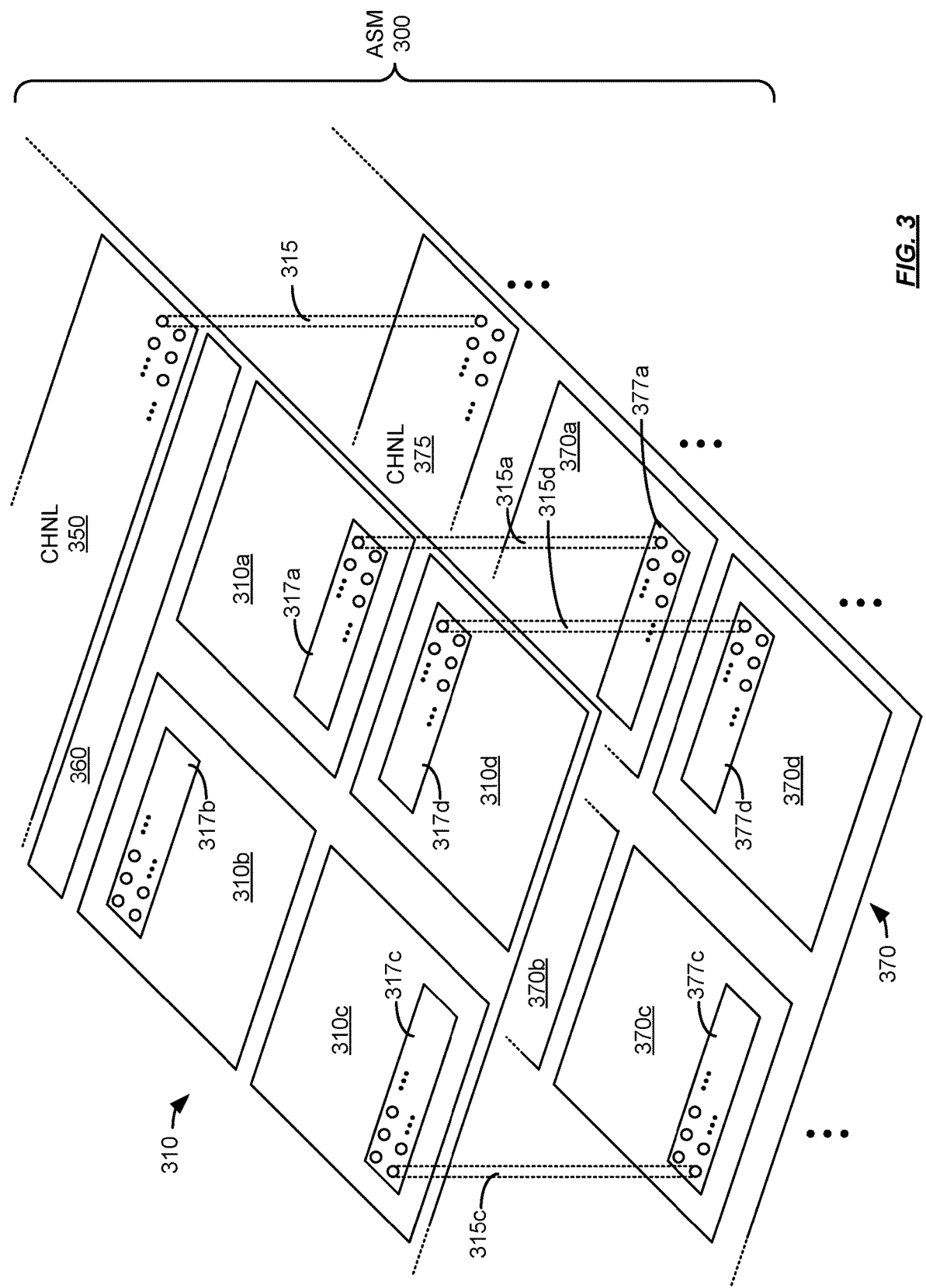
FIG. 3 is an isometric illustration of a high-bandwidth memory (HBM) compatible rate controlled integrated circuit device stack.

FIG. 3 is an isometric illustration of a high-bandwidth memory (HBM) compatible rate controlled integrated circuit device stack. In FIG. 3, assembly 300 includes processing/controller die 310 stacked with DRAM die 370. It should be understood that additional DRAM dies are included in assembly 300. However, these are not illustrated in FIG. 3 because of illustration constraints. Assembly 300 may be, for example, an implementation of system 100 or system 200. Processing/controller die 310 includes channel connections (e.g., TSVs) 350, PE/controllers 310a-310d, and rate control 360. PE/controllers 310a-310d include and/or are coupled to TSV connections 317a-317d, respectively. In an embodiment, channel connections 350 of processing/controller die 310 are connection compatible with an HBM standard. In an embodiment, PE/controllers 310a-310d are or correspond to at least a portion of PE array 110 and/or PE/controllers 211aa-211cd. Thus, for example, die 310 may be an implementation and/or example of die 211.

DRAM die 370 includes channel connections (e.g., TSVs) 375 and DRAM regions 370a-370d. In an embodiment, each DRAM memory region might consist of one or more DRAM memory banks and may include additional circuitry (e.g. to control, connect to, and/or drive TSV connections 317a-317d, and/or included DRAM banks). DRAM regions 370a, 370c, and 370d include and/or are coupled to TSV connections 377a, 377c, and 377d, respectively. DRAM region 370b also includes and/or is coupled to TSV connections. However, in FIG. 3, these TSV connections are obscured by processing/controller die 310 and are therefore not illustrated in FIG. 3. In an embodiment, channel 375 of DRAM die 370 are connection compatible with an HBM standard.

TSV connections 317a, 317c, and 317d of PE/controllers 310a, 310c, and 310d of processing/controller die 310 are aligned with TSV connections 377a, 377c, and 377d of DRAM regions 370a, 370c, and 370d of DRAM die 370, respectively and the TSV connections of the other DRAM dies in assembly 300. Likewise, TSV connections 317b of PE/controller 310b of processing/controller die 310 are aligned with the obscured (in FIG. 3) TSV connections of DRAM region 370b. Channel connections 350 of processing/controller die 310 are aligned with channel connections 375 of DRAM die 370 and the channel connections of the other DRAM dies in assembly 300. Thus, when processing/controller die 310, DRAM die 370, and the other DRAM dies in assembly 300 are stacked with each other, TSV connections 317a-317d of PE/controllers 310a-310d of processing/controller die 310 are electrically connected to TSV connections (e.g., 377a, 377c, and 377d) of DRAM regions 370a-370d of DRAM die 370 and the TSV connections of the other DRAM dies in assembly 300. This is illustrated in FIG. 3 by TSV representations 315a, 315c, and 315d. Likewise, channel connections 350 of processing/controller die 310 are electrically connected with channel connections 375 of DRAM die 370 and the channel connections of the other DRAM dies in assembly 300. This is illustrated in FIG. 3 by TSV representation 315.

TSV connections between PE/controllers 310a-310d, DRAM regions 370a-370d, and the other DRAM regions in assembly 300 form direct channels and allow PE/controllers 310a-310d to access DRAM regions 370a-370d and the DRAM regions of the other DRAM dies in assembly 300. TSV connections between PE/controllers 310a-310d, DRAM regions 370a-370d, and the DRAM regions of the other DRAM dies in assembly 300 form direct channels and allow PE/controllers 310a-310d to access DRAM regions 370a-370d and the DRAM regions of the other DRAM dies in assembly 300 without the data flowing via channel connections 350 and/or channel connections 375. In addition, the direct channels formed by TSV connections between PE/controllers 310a-310d, DRAM regions 370a-370d, and the DRAM regions of the other DRAM dies in assembly 300 allow PE/controllers 310a-310d to access respective DRAM regions 370a-370d and the DRAM regions of the other DRAM dies in assembly 300 independently of each other. PE/controllers 310a-310d accessing respective DRAM regions 370a-370d and the DRAM regions of the other DRAM dies in assembly 300 independently of each other allow PE/controllers 310a-310d to access respective DRAM regions 370a-370d and the DRAM regions of the other DRAM dies in assembly 300 in parallel and/or concurrently—thereby providing a high memory-to-processing element bandwidth and lower latency.

In an embodiment, the direct channels formed by the TSV connections between PE/controllers 310a-310d, DRAM regions 370a-370d, and the DRAM regions of the other DRAM dies in assembly 300 may be made in a common bus type configuration. Communication of commands, addresses, and data between PE/controllers 310a-310d, DRAM regions 370a-370d, and the DRAM regions of the other DRAM dies in assembly 300 on respective common command/address and data busses may use time-division multiplexing. Communication of commands, addresses, and data between PE/controllers 310a-310d, DRAM regions 370a-370d, and the DRAM regions of the other DRAM dies in assembly 300 on a respective common bus may use time-division multiplexing by assigning each of DRAM regions 370a-370d, and the DRAM regions of the other DRAM dies in assembly 300 a repeating time slot to communicate with the PE/controller 310a-310d on the common bus.

Rate control 360 is operatively coupled to each of PE/controllers 310a-310d. Rate control 360 is operatively coupled to each of PE/controllers 310a-310d to, based on the operands and/or results being communicated with DRAM regions 370a-370d and/or internal memory/registers, control the rate that PE/controllers 310a-310d are operated. In particular, rate control 360 may change the frequency of one or more clocks being supplied to the processing element circuitry of PE/controllers 310a-310d.

In an embodiment, the rate that operands, results, and/or instructions are communicated between (i.e., read or written) each PE/controllers 310a-310d and DRAM regions 370a-370d may be limited by the bandwidth of DRAM regions 370a-370d. For example, each PE/controllers 310a-310d may have a maximum operating rate of 1 billion instructions per second (GIPS). Each instruction being executed may, for example, require one 16-bit operand be received from an associated DRAM region 370a-370d. Thus, each of PE/controllers 310a-310d would, if operated at 1 GIPS, require 2 GB/s of data be received from an associated DRAM region 370a-370d. If DRAM regions 370a-370d can supply 2 GB/s of data to its associated PE/controllers 310a-310d, the rate that PE/controllers 310a-310d complete instructions may be set to 1.0 GIPS by rate control 360. If, however, each instruction being executed requires one 32-bit operand be received from an associated DRAM region 370a-370d. Because DRAM regions 370a-370d can only supply 2 GB/s of data to its associated PE/controllers 310a-310d, the rate that PE/controllers 310a-310d complete instructions may be set to 0.5 GIPS by rate control 360.

In an embodiment, based on information about the operands needed by PE/controllers 310a-310d, rate control 360 sets the operating rate of PE/controllers 310a-310d. Thus, for example, based on the information that each instruction being executed by PE/controllers 310a-310d requires one 32-bit operand be received from DRAM regions 370a-370d, and the information that DRAM regions 370a-370d can supply a maximum of 2 GB/s of data to each PE/controllers 310a-310d, rate control 260 would configure one or more clock signals to PE/controllers 310a-310d such that PE/controllers 310a-310d are operated at 0.5 GIPS. In this manner, the rate that PE/controllers 310a-310d are operating (0.5 GIPS) more efficiently matches the maximum rate that DRAM regions 370a-370d are supplying operands to and/or storing results from PE/controllers 310a-310d.

In an embodiment, rate control 360 receives operand information via one or more indicators embedded in instructions to be processed by PE/controllers 310a-310d. In another embodiment, a register or other indicator in rate control 360 is set to provide operand information. In an embodiment, rate control 360 includes a look-up table that relates operand information and DRAM regions 370a-370d bandwidth to operating rates for PE/controllers 310a-310d. In an embodiment, operand information comprises the data types to be (or are being) communicated with associated DRAM regions 370a-370d. An example of this type of table was illustrated in Table 1. Additional tables may relate operand information from other sources (e.g., registers, SRAM, DRAM, flash, etc.) to operating rates for DRAM regions 370a-370d.

It should be understood, that one or more of the functions, operations, configurations, etc. described herein with respect to system 100 and system 200 may also be accomplished by assembly 300. Thus, for the sake of brevity, a discussion of these functions, operations, configurations, etc. will not be repeated herein in with respect to FIG. 3 and assembly 300.

Figure 4:
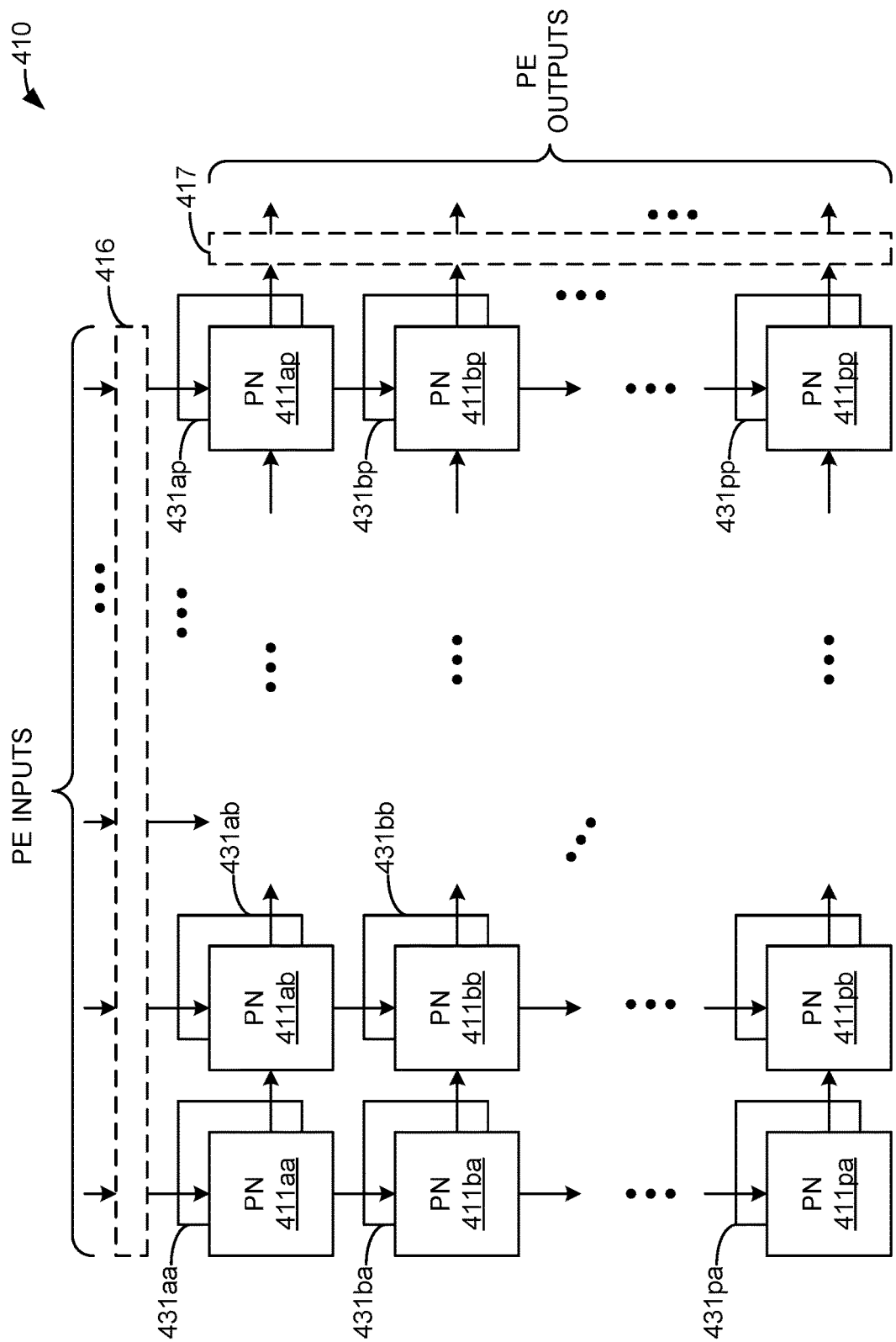
FIG. 4 illustrates an example processing array.

FIG. 4 illustrates an example processing array. In FIG. 4, processing element 410 comprises processing nodes 411aa-411pp, DRAM regions 431aa-431pp, optional input buffer circuitry 416, and optional output buffer circuitry 417. Processing nodes 411aa-411pp and associated directly accessed DRAM regions 431aa-431pp are arranged in a two dimensional grid (array). Processing nodes 411aa-411pp are arranged such that each processing node 411aa-411pp receives an input from the top of the page direction and may provide an output (result) to the next processing node to the right. Processing nodes 411aa-411pp may forward the received input to the next processing node below it. The top row 411aa-411ab of the array of processing element 410 receives respective inputs from input buffer circuitry 416. The righthand most column of the array of processing element 410 provides respective outputs to output buffer circuitry 417. It should be understood that processing element 410 is configured as a systolic array. Thus, each processing node 411aa-411pp in the systolic array of processing element 410 may work in lock step with its neighbors.

In FIG. 4, processing nodes 411aa-411pp may be interpreted to represent a 16×16 (a through p rows and a through p columns) processing node 411aa-411pp array. However, it should be understood that this is merely an example. Any number of rows and any number of columns of processing nodes 411aa-411pp may be implemented.

In an embodiment, based on information about the operands needed by Processing nodes 411aa-411pp, the operating rate of processing nodes 411aa-411pp is set. Thus, for example, based on the information that each instruction being executed by processing nodes 411aa-411pp requires one 32-bit operand be received from directly accessed DRAM regions 431aa-431pp, and the information that directly accessed DRAM regions 431aa-431pp can supply a maximum of 2 GB/s of data to each processing node 411aa-411pp, processing nodes would be operated in lock step at 0.5 GIPS. In this manner, the rate that processing nodes 411aa-411pp are operating (0.5 GIPS) more efficiently matches the maximum rate that DRAM regions 431aa-431pp are supplying operands to and/or storing results from DRAM regions 431aa-431pp.

Figure 5:
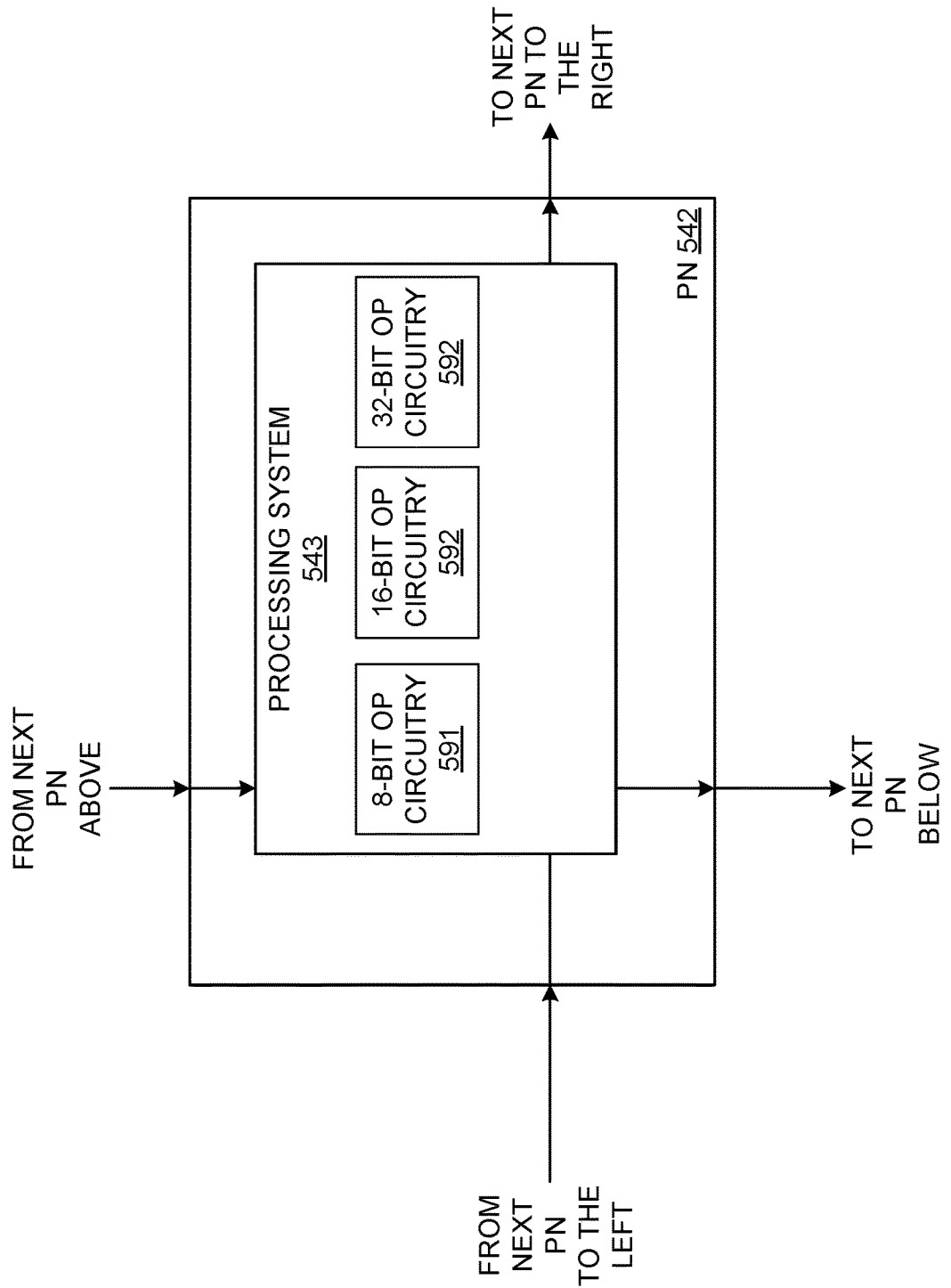
FIG. 5 illustrates an example processing node of a processing element.

FIG. 5 illustrates an example processing node of a processing element. Processing node 542 may be, or be a part of, processing element array 110, processing elements 111-113, PE/controllers 211aa-211cd, and/or PE/controllers 310a-310d. Processing node 542 comprises processing system 543. Processing system 543 includes 8-bit operand processing circuitry 591, 16-bit operand processing circuitry, 592 and 32-bit operand processing circuitry 593.

Processing system 543, and 8-bit operand processing circuitry 591, 16-bit operand processing circuitry 592, and 32-bit operand processing circuitry 593, in particular, may include and/or implement one or more of the following: a memory functions (e.g., a register) and/or SRAM); multiply functions, addition (accumulate) functions, and/or activation functions. For example, 8-bit processing circuitry 591 may comprise an 8-bit arithmetic logic unit to process 8-bit operands as inputs; 16-bit processing circuitry 592 may comprise a 16-bit arithmetic logic unit to process 16-bit operands as inputs; and/or 32-bit processing circuitry 593 may comprise a 32-bit arithmetic logic unit to process 32-bit operands as inputs.

In an embodiment, processing node 542 receives at least one value may be received from the next processing node above processing node 542 (or an input to the processing element) and may be provided to processing system 543. Processing system 543 may be, or include, an application specific integrated circuit (ASIC) device, a graphics processor unit (GPU), a central processing unit (CPU), a system-on-chip (SoC), or an integrated circuit device that includes many circuit blocks such as ones selected from graphics cores, processor cores, and MPEG encoder/decoders, etc.

The output of processing node 542 and/or processing system 543 may be provided to the next processing node to the right (or an output of the processing element.) The at least one value that was received from the next processing node above processing node 542 (or an input to the processing element) may be provided to the next processing node below.

Figure 6:
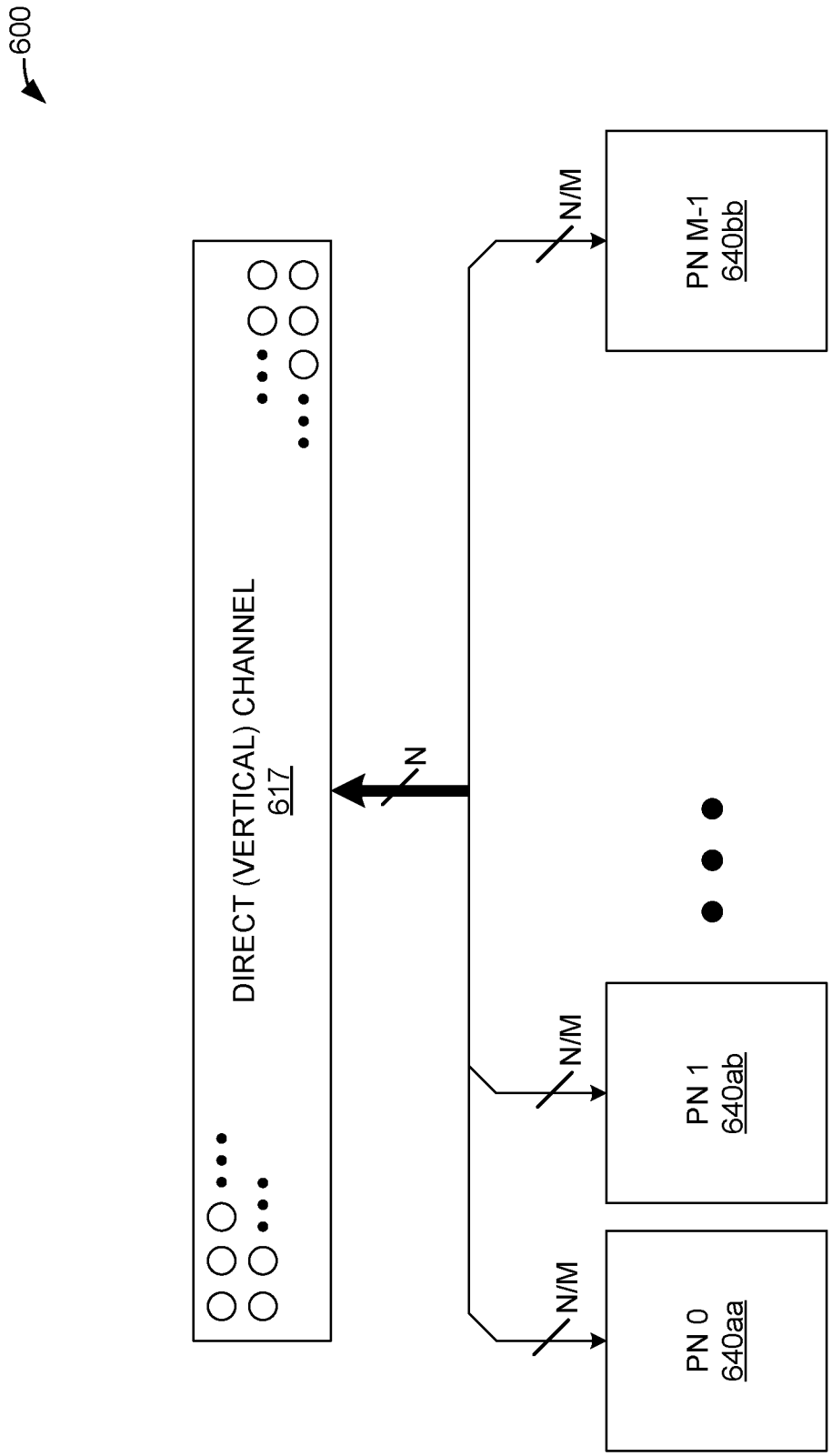
FIG. 6 illustrates an example distribution of memory bandwidth to processing elements.

FIG. 6 illustrates an example distribution of memory bandwidth to processing elements. In FIG. 6, system 600 includes a direct (vertical) channel 617 between a processing element (e.g. PE/controllers 310a) and a DRAM region (e.g., DRAM region 370a) is accessed (read or write) using N number of bits. These N number of bits are distributed to M number of processing nodes 640aa-640bb (e.g., processing nodes 411aa-411pp). Thus, each processing node 640aa-640bb accesses the direct channel using N/M number of bits.

For example, if direct channel 617 has 256 bits and operates at 1 GHz, the amount of data communicated via direct channel 617 is 32 GB/s. If there are sixteen (16) processing nodes 640aa-640bb, each processing node can communicate (e.g., read or write) 2 GB/s via the direct channel using 16 bits of the direct channel. If, for example, each processing node 640aa-640bb is receiving one (1) 16-bit operand per instruction executed, processing nodes 640aa-640bb are operated (e.g., by rate control 360) at 1 GIPS. If, in another example, each processing node 640aa-640bb is receiving two (2) 16-bit operands per instruction executed, processing nodes 640aa-640bb are operated (e.g., by rate control 360) at 0.5 GIPS. Thus, it should be understood that processing nodes 640aa-640bb may be operated at different processing rates based on the operand requirements of the instructions being processed and the amount of direct channel bandwidth allocated to each of processing nodes 640aa-640bb.

FIG. 7 is a flowchart illustrating a method of operating a processing array. One or more steps illustrated in FIG. 6 may be performed by, for example, system 100, system 200, assembly 300, system 400, system 500, and/or their components. By a plurality of processing elements on a processor die, respective ones of a plurality of memory arrays on a memory device electrically coupled to, and stacked with, the processor die are accessed independently of the other of the processing elements via respective array access interfaces (602). For example, PE/controllers 211aa-211cd on processor die 211 may access memory regions 231aa-231cd independently of the other of PE/controllers 211aa-211cd accessing their associated memory regions 231aa-231cd.

A first operand size indicator associated with a first operand size corresponding to data being communicated between the respective ones of the plurality of memory arrays and the plurality of processing elements is determined (704). For example, rate control 260 may determine, receive, or calculate information about the size of operands, results, and/or instructions being communicated (or are to be communicated) between (i.e., read or written) each PE/controller 211aa-211cd and DRAM regions 231aa-231cd 232aa-232cd. The processing elements are operated at a frequency that is selected based on the first operand size indicator (706). For example, based on the information about the size of operands, results, and/or instructions being communicated (or are to be communicated) between (i.e., read or written) each PE/controllers 211aa-211cd and DRAM regions 231aa-231cd 232aa-232cd, rate control 260 may select an operating frequency for PE/controllers 211aa-211cd. In another example, based on information that each instruction being executed by PE/controllers 211aa-211cd requires one 32-bit operand be received from directly accessed DRAM regions 431aa-431bb, and the information that directly accessed DRAM regions 231aa-231cd 232aa-232cd can supply a maximum of 32 GB/s of data to the sixteen (16) processing nodes of PE/controllers 211aa-211cd, rate control 260 would operate PE/controllers 211aa-211cd at 0.5 GIPS. In this manner, the rate that the sixteen (16) processing nodes of PE/controllers 211aa-211cd are operating (0.5 GIPS) more efficiently matches the maximum rate that DRAM regions 231aa-231cd 232aa-232cd are supplying operands to and/or storing results from DRAM regions 231aa-231cd 232aa-232cd.

The methods, systems and devices described above may be implemented in computer systems, or stored by computer systems. The methods described above may also be stored on a non-transitory computer readable medium. Devices, circuits, and systems described herein may be implemented using computer-aided design tools available in the art, and embodied by computer-readable files containing software descriptions of such circuits. This includes, but is not limited to one or more elements of system 100, system 200, assembly 300, system 400, processing node 542, system 600, and their components. These software descriptions may be: behavioral, register transfer, logic component, transistor, and layout geometry-level descriptions. Moreover, the software descriptions may be stored on storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, and so on.

Figure 8:
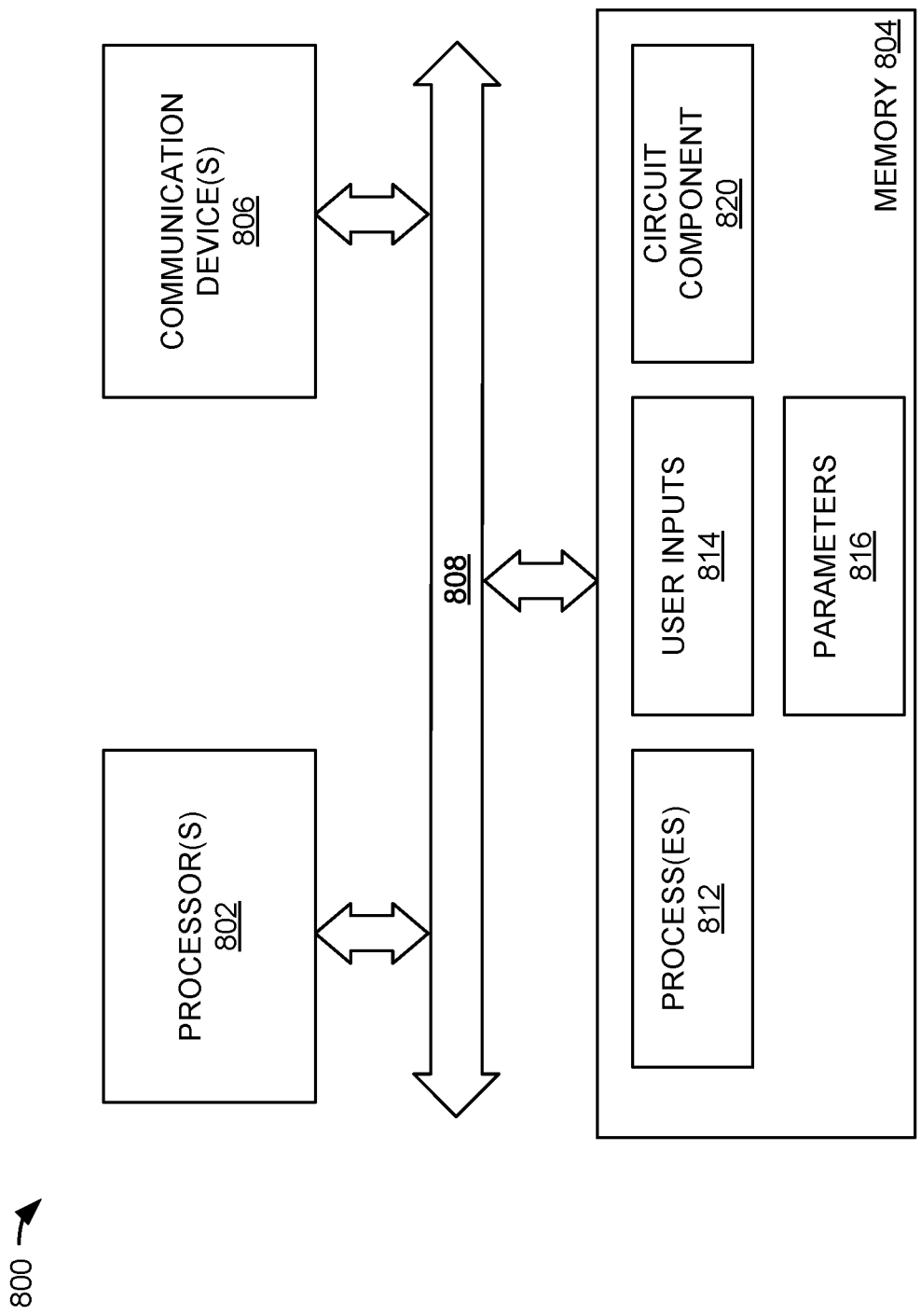
FIG. 8 is a block diagram of a processing system.

FIG. 8 is a block diagram illustrating one embodiment of a processing system 800 for including, processing, or generating, a representation of a circuit component 820. Processing system 800 includes one or more processors 802, a memory 804, and one or more communications devices 806. Processors 802, memory 804, and communications devices 806 communicate using any suitable type, number, and/or configuration of wired and/or wireless connections 808.

Processors 802 execute instructions of one or more processes 812 stored in a memory 804 to process and/or generate circuit component 820 responsive to user inputs 814 and parameters 816. Processes 812 may be any suitable electronic design automation (EDA) tool or portion thereof used to design, simulate, analyze, and/or verify electronic circuitry and/or generate photomasks for electronic circuitry. Representation 820 includes data that describes all or portions of system 100, system 200, assembly 300, system 400, processing node 542, system 600, and their components, as shown in the Figures.

Representation 820 may include one or more of behavioral, register transfer, logic component, transistor, and layout geometry-level descriptions. Moreover, representation 820 may be stored on storage media or communicated by carrier waves.

Data formats in which representation 820 may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email User inputs 814 may comprise input parameters from a keyboard, mouse, voice recognition interface, microphone and speakers, graphical display, touch screen, or other type of user interface device. This user interface may be distributed among multiple interface devices. Parameters 816 may include specifications and/or characteristics that are input to help define representation 820. For example, parameters 816 may include information that defines device types (e.g., NFET, PFET, etc.), topology (e.g., block diagrams, circuit descriptions, schematics, etc.), and/or device descriptions (e.g., device properties, device dimensions, power supply voltages, simulation temperatures, simulation models, etc.).

Memory 804 includes any suitable type, number, and/or configuration of non-transitory computer-readable storage media that stores processes 812, user inputs 814, parameters 816, and circuit component 820.

Communications devices 806 include any suitable type, number, and/or configuration of wired and/or wireless devices that transmit information from processing system 800 to another processing or storage system (not shown) and/or receive information from another processing or storage system (not shown). For example, communications devices 806 may transmit circuit component 820 to another system. Communications devices 806 may receive processes 812, user inputs 814, parameters 816, and/or circuit component 820 and cause processes 812, user inputs 814, parameters 816, and/or circuit component 820 to be stored in memory 804.

Implementations discussed herein include, but are not limited to, the following examples:

Example 1: A device, comprising: a memory die comprising a plurality of memory arrays; and, a processor die, stacked with the memory die, comprising a plurality of processing elements that communicate data directly with respective ones of the plurality of memory arrays, the processor die including sensing circuitry to select a processing speed for the processing elements based on an operand size being communicated between the processing elements and the memory arrays.

Example 2: The device of example 1, wherein the processing elements include first circuitry configured to process operands having a first size and second circuitry configured to process operands having a second size.

Example 3: The device of example 2, wherein an instruction being executed by a processing element determines which of the first circuitry and the second circuitry is selected.

Example 4: The device of example 3, wherein the sensing circuitry selects the processing speed based at least in part on the instruction.

Example 5: The device of example 1, wherein processing speed selection is further based on a communication bandwidth between the processing elements and the memory arrays.

Example 6: The device of example 1, wherein processing speed selection is further based on an access cycle time of the memory arrays.

Example 7: The device of example 1, wherein the plurality of processing elements communicate data directly with respective ones of the plurality of memory arrays using through-silicon via (TSVs).

Example 8: A device, comprising: a memory device die comprising a plurality of memory arrays, the memory arrays to be accessed independently of the other of the plurality of memory arrays via respective array access interfaces; and, a processor die comprising a plurality of processing elements, the processor die electrically coupled to, and stacked with, the memory device die, each of the processing elements connected to at least one array access interface to communicate data directly with a respective memory array, the processor die including circuitry configured to determine an operand size being communicated with the memory device die by the processing elements and to, based on the operand size, select a clock frequency to be supplied to the processing elements.

Example 9: The device of example 8, wherein the processing elements include first circuitry configured to process operands having a first size and second circuitry configured to process operands having a second size.

Example 10: The device of example 9, wherein an instruction being executed by a processing element determines which of the first circuitry and the second circuitry is selected.

Example 11: The device of example 10, wherein the clock frequency selected is based at least in part on the instruction.

Example 12: The device of example 8, wherein clock frequency selection is further based on a communication bandwidth between the processing elements and the memory arrays.

Example 13: The device of example 8, wherein clock frequency selection is further based on an access cycle time of the memory arrays.

Example 14: The device of example 8, wherein the array access interfaces are connected to the plurality of processing elements using through-silicon via (TSVs).

Example 15: A method, comprising: accessing, by a plurality of processing elements on a processor die, respective ones of a plurality of memory arrays on a memory device die electrically coupled to, and stacked with, the processor die, independently of the other of the processing elements via respective array access interfaces; determining a first operand size indicator associated with a first operand size corresponding to data being communicated between the respective ones of the plurality of memory arrays and the plurality of processing elements; and, operating the processing elements at a first operating frequency that is selected based on the first operand size indicator.

Example 16: The method of example 15, further comprising: determining a second operand size indicator associated with a second operand size corresponding to data being communicated between the respective ones of the plurality of memory arrays and the plurality of processing elements; and, operating the processing elements at a second operating frequency that is selected based on the second operand size indicator.

Example 17: The method of example 16, wherein determining the first operand size indicator is based on a first instruction to be executed by the processing elements.

Example 18: The method of example 17, wherein determining the second operand size indicator is based on a second instruction to be executed by the processing elements.

Example 19: The method of example 16, wherein determining the first operand size indicator is based on a first instruction that is to be repeatedly executed by the processing elements.

Example 20: The method of example 19, wherein determining the second operand size indicator is based on a second instruction to be repeatedly executed by the processing elements.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A device, comprising:
a memory die comprising a plurality of memory arrays; and,
a processor die, stacked with the memory die, comprising a plurality of processing elements that communicate data directly with respective ones of the plurality of memory arrays, the processor die including sensing circuitry to select a processing speed for the processing elements based on an operand size being communicated between the processing elements and the memory arrays.

2. The device of claim 1, wherein the processing elements include first circuitry configured to process operands having a first size and second circuitry configured to process operands having a second size.

3. The device of claim 2, wherein an instruction being executed by a processing element determines which of the first circuitry and the second circuitry is selected.

4. The device of claim 3, wherein the sensing circuitry selects the processing speed based at least in part on the instruction.

5. The device of claim 1, wherein processing speed selection is further based on a communication bandwidth between the processing elements and the memory arrays.

6. The device of claim 1, wherein processing speed selection is further based on an access cycle time of the memory arrays.

7. The device of claim 1, wherein the plurality of processing elements communicate data directly with respective ones of the plurality of memory arrays using through-silicon via (TSVs).

8. A device, comprising:
a memory device die comprising a plurality of memory arrays, the memory arrays to be accessed independently of the other of the plurality of memory arrays via respective array access interfaces; and,
a processor die comprising a plurality of processing elements, the processor die electrically coupled to, and stacked with, the memory device die, each of the processing elements connected to at least one array access interface to communicate data directly with a respective memory array, the processor die including circuitry configured to determine an operand size being communicated with the memory device die by the processing elements and to, based on the operand size, select a clock frequency to be supplied to the processing elements.

9. The device of claim 8, wherein the processing elements include first circuitry configured to process operands having a first size and second circuitry configured to process operands having a second size.

10. The device of claim 9, wherein an instruction being executed by a processing element determines which of the first circuitry and the second circuitry is selected.

11. The device of claim 10, wherein the clock frequency selected is based at least in part on the instruction.

12. The device of claim 8, wherein clock frequency selection is further based on a communication bandwidth between the processing elements and the memory arrays.

13. The device of claim 8, wherein clock frequency selection is further based on an access cycle time of the memory arrays.

14. The device of claim 8, wherein the array access interfaces are connected to the plurality of processing elements using through-silicon via (TSVs).

15. A method, comprising:
accessing, by a plurality of processing elements on a processor die, respective ones of a plurality of memory arrays on a memory device die electrically coupled to, and stacked with, the processor die, independently of the other of the processing elements via respective array access interfaces;
determining a first operand size indicator associated with a first operand size corresponding to data being communicated between the respective ones of the plurality of memory arrays and the plurality of processing elements; and, operating the processing elements at a first operating frequency that is selected based on the first operand size indicator.

16. The method of claim 15, further comprising:

determining a second operand size indicator associated with a second operand size corresponding to data being communicated between the respective ones of the plurality of memory arrays and the plurality of processing elements; and, operating the processing elements at a second operating frequency that is selected based on the second operand size indicator.

17. The method of claim 16, wherein determining the first operand size indicator is based on a first instruction to be executed by the processing elements.

18. The method of claim 17, wherein determining the second operand size indicator is based on a second instruction to be executed by the processing elements.

19. The method of claim 16, wherein determining the first operand size indicator is based on a first instruction that is to be repeatedly executed by the processing elements.

20. The method of claim 19, wherein determining the second operand size indicator is based on a second instruction to be repeatedly executed by the processing elements.

* * * * *